United States Patent [19]

Kirino et al.

[11] Patent Number: 5,047,713

[45] Date of Patent: Sep. 10, 1991

[54] METHOD AND APPARATUS FOR MEASURING A DEEP IMPURITY LEVEL OF A SEMICONDUCTOR CRYSTAL

[75] Inventors: Yoshio Kirino; Tateo Kusama, both of Tokyo, Japan

[73] Assignees: Semitex Co., Ltd.; Toshiba Ceramics Co., Ltd., both of Tokyo, Japan

[21] Appl. No.: 612,926

[22] Filed: Nov. 14, 1990

[30] Foreign Application Priority Data

Aug. 9, 1990 [JP] Japan .................................. 2-211122

[51] Int. Cl.$^5$ ............................................. G01R 31/26
[52] U.S. Cl. ........................... 324/158 R; 324/158 D; 324/158 T; 374/4
[58] Field of Search .................... 374/5, 4, 43, 45, 57; 324/158, 158 T, 158 R, 158 D

[56] References Cited

U.S. PATENT DOCUMENTS

| | | | |
|---|---|---|---|
| 3,605,015 | 9/1971 | Copeland, III | 324/158 D |
| 4,437,060 | 3/1984 | Ferenczi et al. | 324/158 D |
| 4,551,674 | 11/1985 | Miller | 324/158 R |
| 4,581,578 | 4/1986 | Honma et al. | 324/158 D |
| 4,704,576 | 11/1987 | Tributsch et al. | 324/158 D |
| 4,755,748 | 7/1988 | Lin | 324/158 D |
| 4,839,588 | 6/1989 | Jantsch et al. | 324/158 D |
| 4,875,004 | 10/1989 | Boyd | 324/158 D |
| 4,949,034 | 8/1990 | Imura et al. | 324/158 D |

OTHER PUBLICATIONS

D. V. Lang, "Deep Level Transient Spectroscopy: A New Method to Characterize Traps in Semiconductors," Journal of Applied Physics, vol. 45, No. 7, Jul. 1974, pp. 3023-3032.

Jacobs et al., "Microwave Techniques in Measurement of Lifetime in Germanium," Journal of Applied Physics, vol. 30, No. 7, Jul. 1959, pp. 1054-1060.

*Methods of Measurement for Semiconductor Materials, Process Controls and Devices*, Quaterly, 04.01 to 06.30.69.

Primary Examiner—William A. Cuchlinski, Jr.
Assistant Examiner—G. Bradley Bennett
Attorney, Agent, or Firm—Finnegan, Henderson, Farabow, Garrett, and Dunner

[57] ABSTRACT

A semiconductor specimen is held by a stage which is equipped with a heater (and a cooler) to change the temperature of the specimen in a predetermined range. Minority carriers are generated in the specimen by irradiating it with an energy beam such as a laser beam. A signal reflecting the recombination process of minority carriers is detected in a non-contact manner by a combination of microwave oscillator and a microwave detector through the microwave impedance coupling with the specimen. Decay curves are obtained at a plurality of temperatures in the predetermined range. A deep impurity level in the specimen is determined by performing an Arrhenius' plot on the basis of the plurality of signal decay curves and the corresponding specimen temperatures.

10 Claims, 5 Drawing Sheets

METHOD AND APPARATUS FOR MEASURING A DEEP IMPURITY LEVEL OF A SEMICONDUCTOR CRYSTAL

BACKGROUND OF THE INVENTION

The deep level transient spectroscopy (DLTS) method is commonly known as one technique for measuring a deep impurity level of a semiconductor crystal. After the original work by D. V. Lang (J. Appl. Phys., Vol. 45, No. 7, pp. 3023-3032, 1974), the DLTS method has been improved and extended by many researchers. However, even in the improved versions it is still required to form an electrode on a specimen. DLTS instruments commercially available include ones from Hewlett Packard Co. and Bio-Rad Co., Ltd., and are based on the technique developed by D. V. Lang.

There exist chemical analysis methods, e.g., SIMS, for directly identifying atom species which form deep impurity levels. However, in these methods, a specimen is destroyed as a result of measurement.

On the other hand, it is noteworthy that the minority carrier lifetime is a parameter which is influenced by impurities forming deep levels in a semiconductor. Non-contact methods for measuring the minority carrier lifetime have already been developed, which include: R. D. Westbrook, ed., "Lifetime Factors in Silicon", ASTM, PA, 1980; and a laser/microwave method of H. Jacobs et. al., J. Appl. Phys., Vol. 30, No. 7, pp. 1054-1060, 1959. Instruments based on such methods are now marketed by several companies. Although these methods and instruments are non-destructive, they cannot determine the level of related impurities.

Since a conventional DLTS method necessarily requires the formation of an electrode on a specimen, it cannot be non-destructive or of non-contact. In the DLTS method, the quality of the electrode formation process affects measurement results as disturbances. Further, in practicing the DLTS method, it is necessary to cool a specimen by liquid nitrogen, etc., which requires a measuring instrument to have a vacuum system. As a result, it is difficult to simplify the instrument and there exist many restrictions on the specimen shape.

As described above, other methods such as an SIMS analysis are essentially destructive. Further, parameters which can be obtained from a semiconductor wafer in a non-contact manner are restricted to the shape/dimension, resistivity, minority carrier lifetime, etc.

In the present situation of the art as described above, it is pointed out that requirements for the quality of semiconductor wafers are now becoming so severe that satisfactory evaluation of semiconductor devices cannot be attained without evaluating substrates themselves which constitute the devices. Therefore, it has been desired to establish a method and apparatus capable of quantitative measurement of a deep impurity level in a non-contact, non-destructive manner.

SUMMARY OF THE INVENTION

An object of the present invention is, therefore, to provide a method and apparatus capable of measurement of a deep impurity level of a semiconductor crystal in a non-contact, non-destructive manner.

According to the invention, an apparatus for measuring a deep impurity level in a semiconductor specimen comprises:

stage means for holding the specimen, and for changing a temperature of the specimen within a predetermined range;

beam source means for irradiating the specimen with an energy beam to generate minority carriers in it;

probe means for detecting, in a non-contact manner, a signal reflecting a temporal change in concentration of the minority carriers;

means for producing a signal decay curve on the basis of the detection signal from the probe means;

memory means for storing a plurality of the signal decay curves obtained at the respective temperatures of the specimen; and computing means for controlling the beam source means, and the probe means and/or the decay curve producing means so that they operate in a synchronized manner, and for determining the impurity level by performing an Errhenius' plot on the basis of the plurality of the signal decay curves and the corresponding temperatures.

DETAILED DESCRIPTION OF THE PREFERRED EMBODIMENTS

Figure 1:
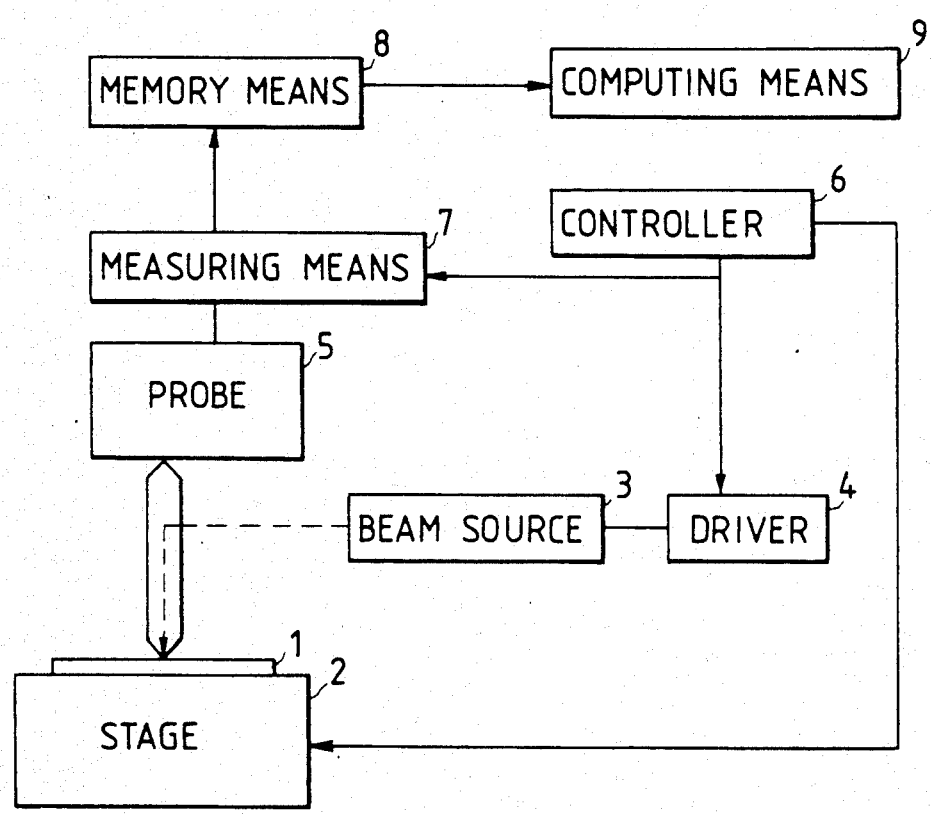
FIG. 1 is a block diagram showing the basic construction of a measuring apparatus according to the present invention.

Referring to FIG. 1, the basic construction of a measuring apparatus according to the present invention is described.

A semiconductor specimen 1 to be measured is held on a stage 2 and its temperature is varied through contact with the stage 2 which is equipped with a heating/cooling device. It is desirable that the heating/cooling device is constructed so as to be able to change the specimen temperature from −183° C. (liquid nitrogen temperature) to 475° C. (the upper limit temperature below which oxygen donors are not generated in the semiconductor specimen 1 in a short period). In a simplified case, the specimen temperature may be changed from about 20° C. (room temperature) to about 280° C. (the upper limit temperature below which a tool made of fluorocarbon polymers (e.g., Teflon, TM of Dupont Co.) can be in practical use). In the case where the stage 2 is capable of cooling the specimen 1 to a temperature lower than the room temperature, there are required a specimen chamber and a mechanism for providing a vacuum condition or a dry gas inside the chamber.

Minority carriers are generated in the semiconductor specimen 1, in a non-contact manner, by an energy beam emitted from a beam source 3, such as a laser diode, which is driven by a driver 4. A signal reflecting the recombination/extinction process of minority carriers is detected, also in a non-contact manner, by a probe 5 such as a combination of a microwave oscillator and a microwave detector.

A controller 6 controls the temperature of the specimen 1, and also controls the energy beam emission of the beam source 3 and the signal detection of the probe 5/measuring means 7 so that these operations are performed in a synchronized manner. Based on an output signal from the probe 5, the measuring means 7 provides a signal decay curve, which is then stored by a memory means 8.

The signal decay curves are sequentially obtained at a plurality of specimen temperatures in an arbitrarily determined range, and then stored in the memory means 8. In obtaining the signal decay curves, conditions other than the specimen temperature, such as those related to the minority carrier generation and a measurement position of the specimen 1, are kept unchanged. The signal-sampling condition may be selected arbitrarily as long as it does not affect the analyzing process described below.

A deep energy level of a particular impurity is determined, in a computing means 9, by subjecting the signal decay curves to the following analyzing procedure. First, for each signal decay curve obtained at a specimen temperature T, a difference between signal values at times $t_1$ and $t_2$ is calculated as:

$$\Delta S(T) = S(T, t_1) - S(T, t_2)$$

where optionally determined times $t_1$ and $t_2$ are measured from the start of the minority carrier generation, i.e., excitation of the specimen 1. Further, there is determined, for a combination of $t_1$ and $t_2$, a specimen temperature $T_m$ at which the above $\Delta S(T)$ takes the maximum, and a value w defined by:

$$w = \ln(t_1/t_2)/(t_1 - t_2).$$

Next, the above procedure is repeated while changing the times $t_1$ and $t_2$, to obtain a plurality of combinations of $T_m$ and w. Finally, using the resulting combinations of $T_m$ and w, a correlation between $\ln(w/T_m^2)$ and $(1/T_m)$ is plotted (Arrhenius' plot) and the impurity energy level is determined from the slope of this correlation.

It is noted that the above analyzing procedure is the same as that of the capacitance DLTS method, which was established by D. V. Lang, except that the invention utilizes the original signals reflecting the recombination/extinction process of minority carriers while the conventional DLTS method analyzes the signals representing the emission/generation process of minority carriers from deep impurity levels in a depletion layer. Although the computing procedure is the same between the two methods, the difference of the signals to be analyzed is essential and mechanism of the analysis is totally different.

EXAMPLE

Experimental measurements were conducted using several semiconductor specimens: p-type single crystal silicon wafers each doped at the crystal-growth stage with, in addition to B, impurity metal of Na, Cr, Fe, Co, Ni, Cu, W or Au; and a p-type single crystal silicon wafer not doped with impurity metal. Such specimens are the same as usual one-side mirror-polished wafers available on the market except that the above impurity metal is added for the purpose of investigating the measurement techniques for determining a deep impurity level. In other words, such specimens were subjected to no special working or processing. Table 1 shows the impurity concentrations and resistivities of those wafer specimens together with the activation energies which were determined by the experimental measurements under discussion. (CZ-Si wafers, p-type, <100>, 65 mm-diameter)

TABLE 1

| Doped Metal | Concentration $(CM^{-3})$ | Resistivity $(\Omega cm)$ | Activation Energy (eV) |
|---|---|---|---|
| none | — | 10–15 | none |
| Na | $<2.0 \times 10^{12}$ | 12–15 | 0.18 |
| Cr | $1.6 \times 10^{13}$ | 11–15 | 0.22 |
| Fe | $6.1 \times 10^{13}$ | 9–13 | 0.13 |
| Co | $3.9 \times 10^{13}$ | 12–15 | 0.40 |
| Ni | $7.0 \times 10^{12}$ | 11–15 | 0.22 |
| Cu | $6.5 \times 10^{14}$ | 12–15 | 0.23 |
| W | $8.5 \times 10^{11}$ | 25–32 | 0.24 |
| Au | $3.1 \times 10^{13}$ | 10–15 | 0.16 |

Figure 2:
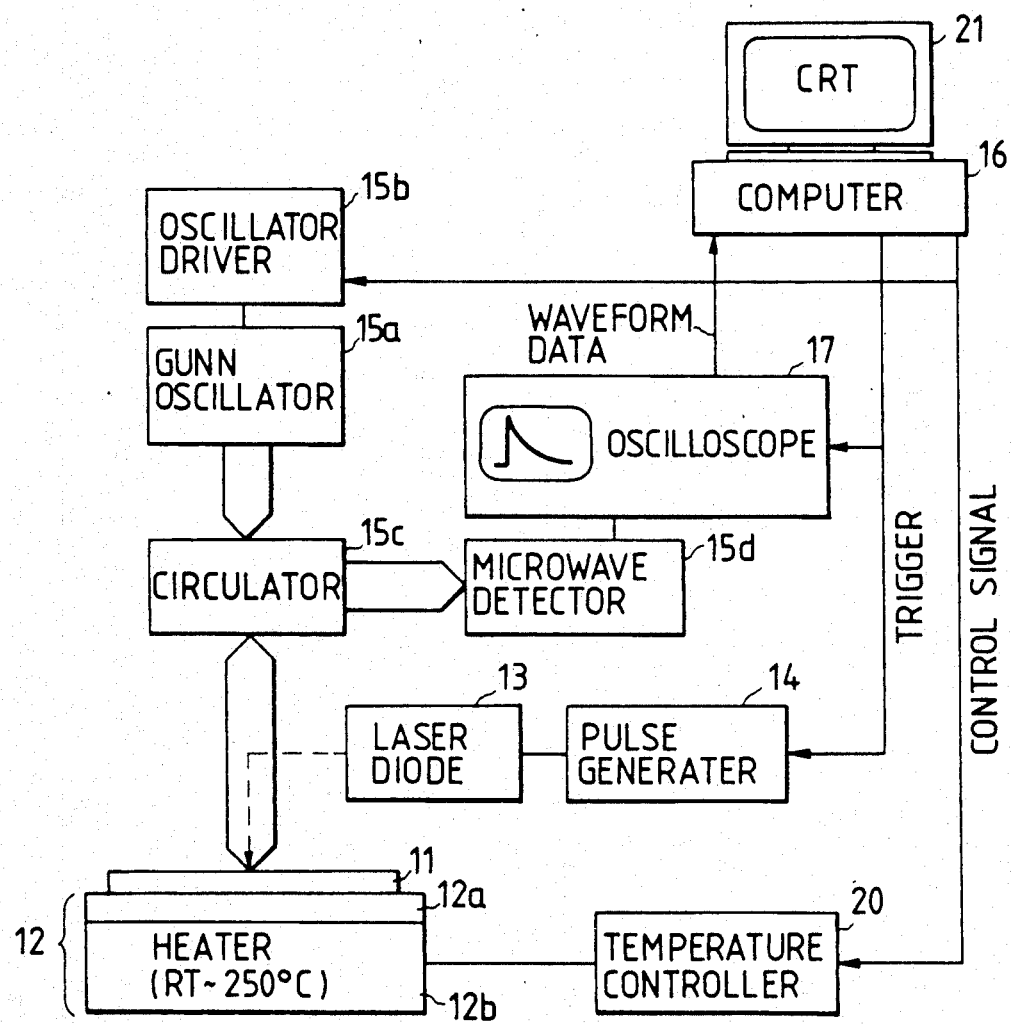
FIG. 2 is a block diagram showing a measuring apparatus according to an embodiment of the invention.

FIG. 2 is a block diagram showing a measuring system used in this experiment. A specimen-holding stage 12 consists of a quartz plate 12a which is in contact with a silicon wafer 11, and a heater 12b which can change the temperature of the wafer 11 from the room temperature to 250° C. Insertion of the quartz plate 12a is to electrically isolate the wafer 11 from the heater 12b and to maintain the purity of the wafer 11. The wafer 11 is irradiated with a laser beam having a wavelength of 910 nm emitted from a laser diode 13 which is driven by a pulse generator 14. A microwave of 14 GHz generated by a Gunn oscillator 15a, which is driven by a oscillator driver 15b, is incident on the wafer 11 via a circulator 15c. The microwave reflected from the wafer 11, which carries information relating to the excited minority carriers (the microwave interacts with the wafer 11 through the impedance coupling), is directed by the circulator 15c toward a microwave detector 15d. An output detection voltage signal of the microwave detector 15d is provided to an oscilloscope 17, in which the voltage signal is displayed and sampled/digitized. The resultant data are finally sent to a computer 16 as signal decay curve data. The computer 16 stores the decay curve data and performs the computing procedure described above. Measurement results are displayed on a CRT display 21.

The computer 16 sends a control signal to a temperature controller 20 to thereby control the heater 12b, as well as to the oscillator driver 15b to thereby control the Gunn oscillator 15a. Further, the computer 16 sends a trigger to the pulse generator 14 and oscilloscope 17 so that the emission of the excitation laser beam and the signal detecting operation are carried out in a synchronized manner.

Each unit of the measuring system was adjusted preliminarily so that the response of the microwave impedance coupling became approximately linear. Further, the output power of the laser diode 13 was adjusted so that the peak value of the output signal from the microwave detector 15d fell within the range of from 500 mV to 1500 mV. After completion of these adjustments, measurements were conducted to obtain the signal decay curves while changing the specimen temperature from 50° C. to 206° C. with a step of 4° C. It is noted here that this sampling condition of the specimen temperature was just selected so as to satisfy the system's memory capacity for the decay curves, and it is desirable, to achive more reliable measurements, to employ as broad a temperature range and as small a step as possible.

Figure 3:
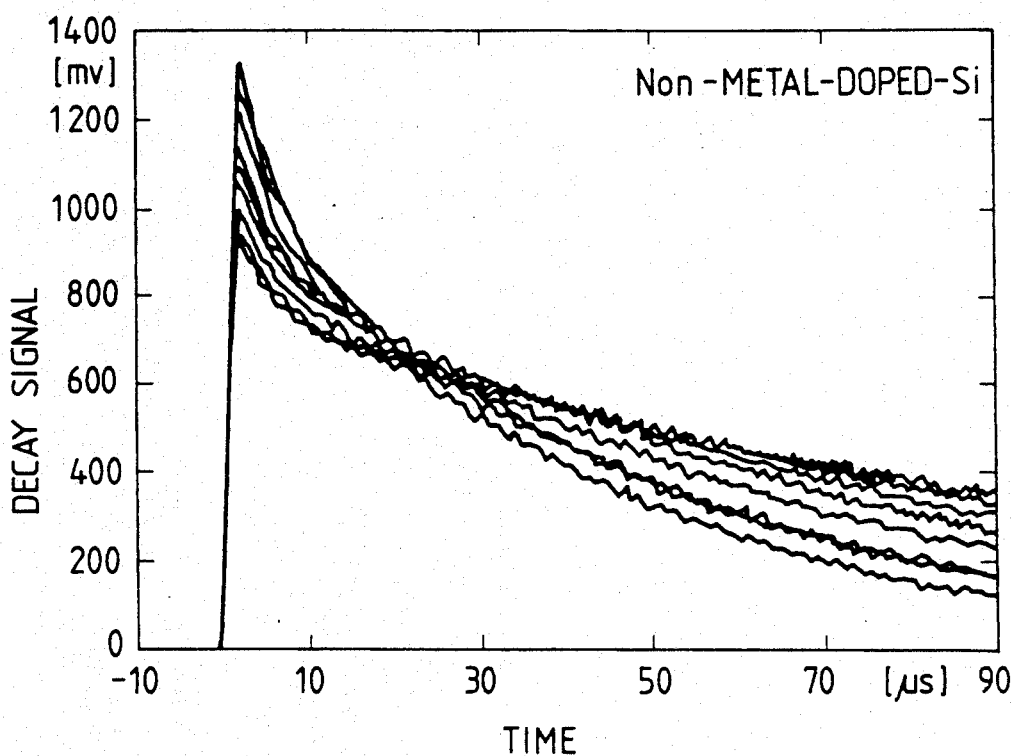
FIGS. 3 and 4 are graphs showing examples of output decay curve data.
Figure 4:
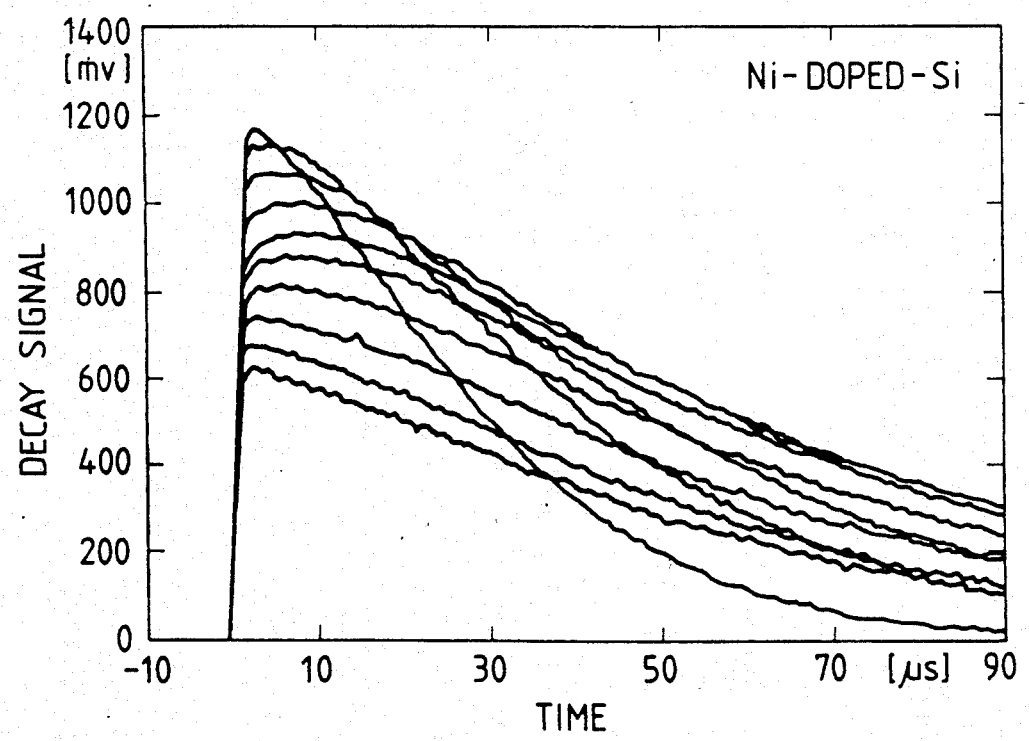

FIGS. 3 and 4 show examples of the output decay curve data obtained from a non-metal-doped Si wafer and a Ni-doped Si wafer, respectively. Each figure contains decay curves obtained at a plurality of specimen temperatures, and each decay curve corresponds to one temperature.

Figure 5:
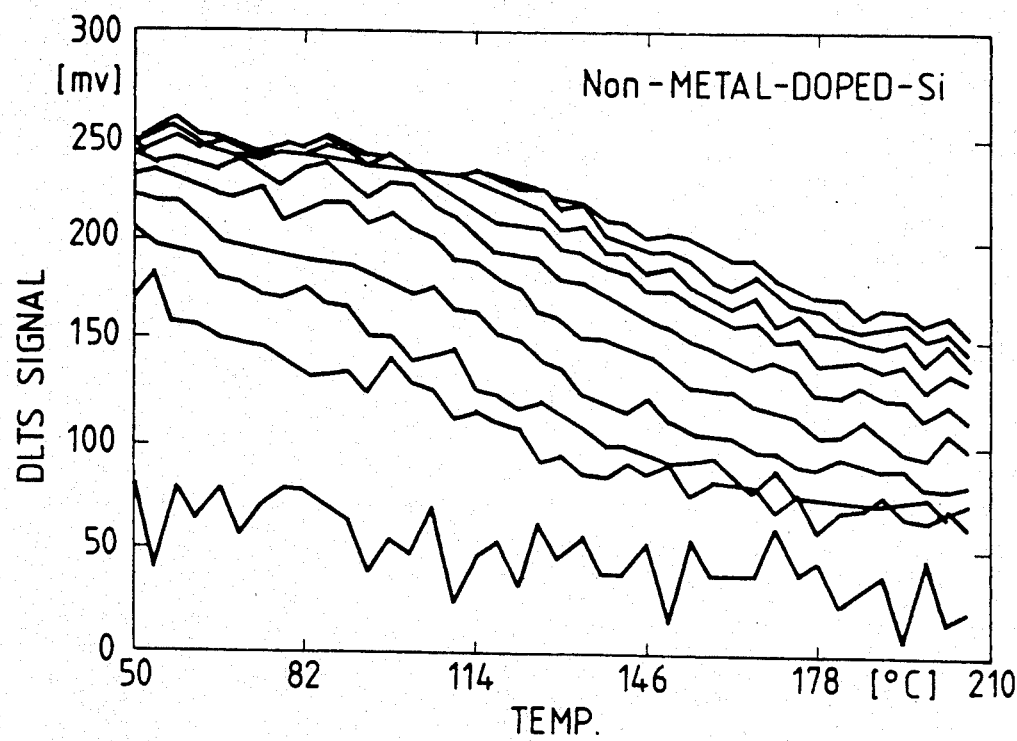
FIGS. 5 and 6 are graphs showing examples of the relationship between the difference of the output data at $t_1$ and $t_2$ and the specimen temperature.
Figure 6:
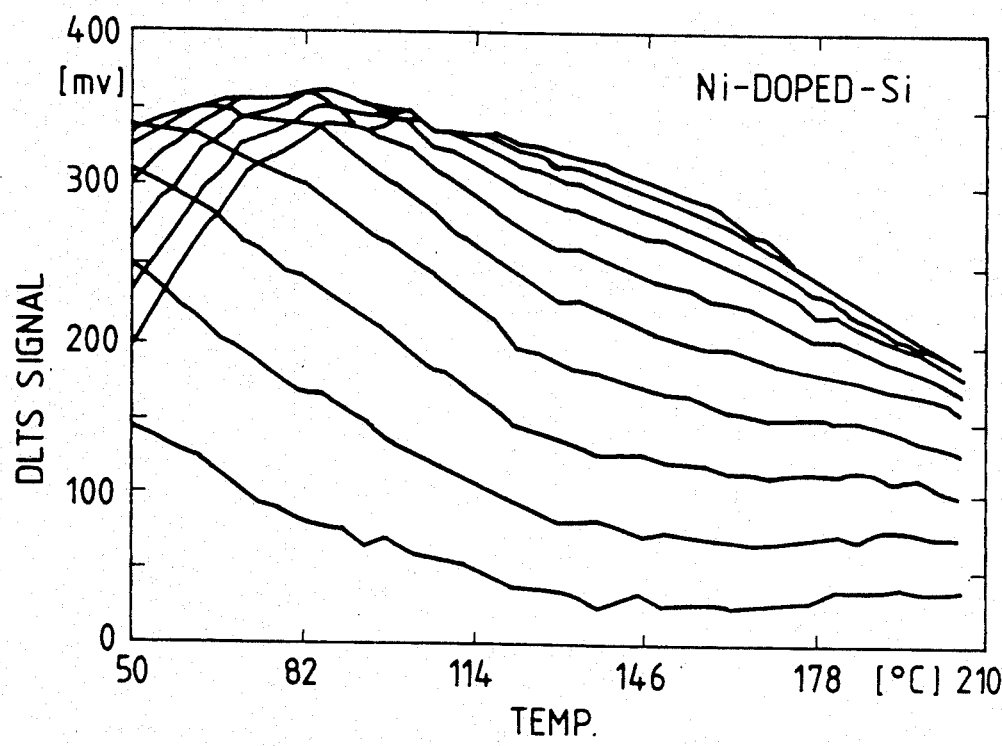

FIGS. 5 and 6 are graphs showing examples of the relationship between the difference of the output data at $t_1$ and $t_2$ (DLTS signal) and the specimen temperature for the non-metal-doped Si wafer and the Ni-doped Si wafer, respectively. Each figure contains a plurality of curves each representing the difference obtained corresponding to a combination of two points of time $t_1$ and $t_2$ which were set so as to maintain the relationship of $t_2 = 2 \times t_1$. That is, each difference curve corresponds to one combination of $t_1$ and $t_2$, i.e., w. It is understood that peaks appear only in FIG. 6 which is from the Si wafer doped with impurity metal, in this case, Ni.

Figure 7:
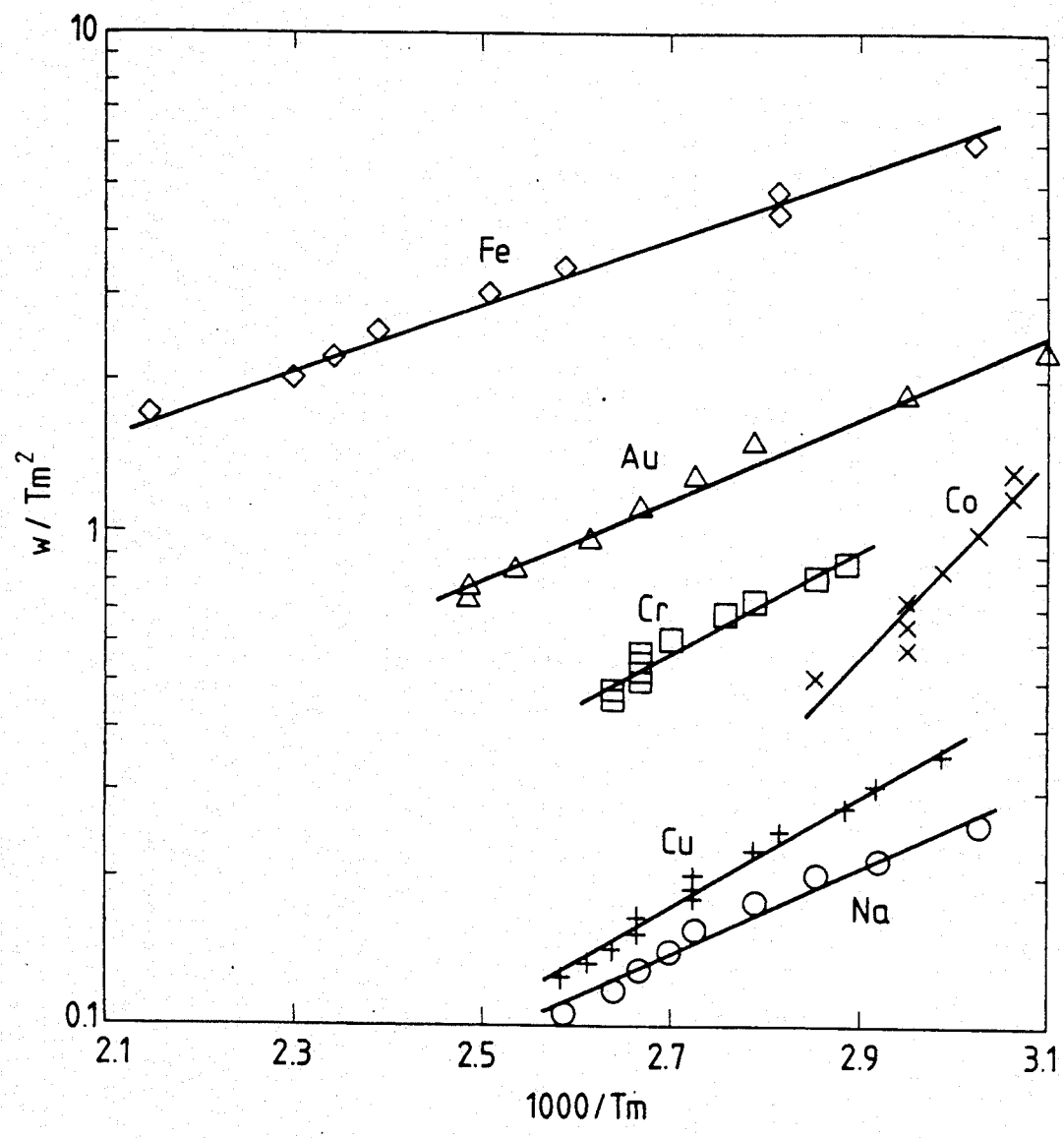
FIG. 7 is a graph showing examples of Arrhenius' plots.

Determining the temperatures $T_m$ corresponding to a plurality of peaks in FIG. 6, combinations of w and $T_m$ were obtained for the Ni-doped Si wafer. FIG. 7 shows examples of the plot of $\ln(w/T_m^2)$ vs $1,000/T_m$ for various impurity metals, which were obtained by the experimental measurements. The activation energy of each deep impurity level was determined from the slope of the line corresponding to the impurity level.

This experiment shows that the invention makes it possible to measure a deep impurity level in a non-destructive manner without subjecting a specimen to any special treatment and also without any physical contact to the mirror-polished side of a specimen, which contact would affect the succeeding manufacture of a semiconductor device.

In the invention, it is fundamental to generate minority carriers in a non-contact manner, obtain, also in a non-contact manner, the signals reflecting the recombination/extinction process of minority carriers for a plurality of specimen temperatures, and perform the above analysis with respect to the signals thus obtained.

The excitation of a semiconductor specimen to generate minority carriers can be performed with any electromagnetic wave having an energy higher than the bandgap of the semiconductor specimen, which is about 0.66 eV in the case of Ge and about 1.1 eV in the case of Si. Therefore, the invention does not impose any limitation on the type of the excitation electromagnetic wave except for its energy. Minority carriers may be directly injected by irradiating a specimen with an electron beam, positron beam, charged particle beam, or the like. However, in practice the use of such beams requires a specimen to be placed in vacuum, which deteriorates economy and operational easiness of the measuring apparatus. The use of an electromagnetic wave of unnecessarily short wavelength would also cause adverse effects such as increase of noise originating from the specimen surface, increase of the specimen temperature, and ionization of the air along the wave path. Therefore, from a practical point of view, the wavelength should be within the range defined by the wavelengths corresponding to the bandgap energy of Si and about 2.5 eV.

In general, a signal reflecting the recombination process of minority carriers may be picked up in a non-contact manner by detecting the change in dielectric constant of a specimen. Therefore, in addition to the method utilizing the microwave impedance coupling as described in the above example, a usable signal may be obtained by other methods such as the detection of induction current based on the Faraday's law and the measurement of reflectance or transmittance of an electromagnetic wave. In the case based on the Faraday's law, the probe 3 consists of an induction coil, an a.c. oscillator and a power meter. However, since the operational principle of the invention requires the specimen-holding stage 2 to control the specimen temperature, the methods other than the impedance coupling method and reflectance measurement using an electromagnetic wave, including a microwave, are not suitable. This is because, with such other methods, the stage 2 necessarily becomes complicated, deteriorating economical and operational easiness of the measuring apparatus.

The above description is devoted to the case in which only one impurity energy level is measured for a single specimen. However, the present invention is applicable to the case of measuring a plurality of impurity levels included in a single specimen. In this latter case, although it suffices to obtain the signals one time, the analyzing process should be conducted at a plurality of times corresponding to the number of impurity levels to be measured.

As described above, the present invention has realized the non-contact, non-destructive measurement of a deep impurity level in a semiconductor substrate by improving and extending the measuring system and signal processing system of the non-contact measuring method of the monority carrier lifetime, and further applying the data analyzing procedure of the DLTS method which in itself belongs to a different category. As a result, it has become possible to easily determine an impurity level existing in a specimen itself in a short period of time without receiving any adverse influence from a process of forming an electrode on a specimen, and further to use, as an actual substrate for a semiconductor device, the specimen itself which has been subjected to the measurement. These are improvements which the prior art measurement techniques of a deep impurity level can by no means provide.

Additionally, since the invention does not necessarily require the cooling of a specimen by liquid nitrogen etc., there are only few limitations on the shape of a specimen and the structure of the specimen-holding part. This presents the simplification of the apparatus structure and a resultant improvement in economy, and also facilitates the application to the mapping measurement which could not be attained by the prior art without constructing an extremely complicated apparatus.

Further, since, unlike the conventional DLTS method, the invention does not require the formation of a depletion layer in a semiconductor specimen, it may provide a possibility of identifying an impurity level which cannot be determined by the conventional DLTS method.

What is claimed is:

1. An apparatus for measuring a deep impurity level in a semiconductor specimen, comprising:
   stage means for holding the specimen, and for changing a temperature of the specimen within a predetermined range;
   beam source means for irradiating the specimen with an energy beam to generate minority carriers in it;
   probe means for detecting, in a non-contact manner, a signal reflecting a temporal change in concentration of the minority carriers;
   means for producing a signal decay curve on the basis of the detection signal from the probe means;

memory means for storing a plurality of the signal decay curves obtained at the respective temperatures of the specimen; and computing means for controlling the beam source means, and the probe means and/or the decay curve producing means so that they operate in a synchronized manner, and for determining the impurity level by performing an Arrhenius' plot on the basis of the plurality of the signal decay curves and the corresponding temperatures.

2. The apparatus according to claim 1, wherein the predetermined range includes a range of from about 20° C. to about 280° C.

3. The apparatus according to claim 1, wherein the energy beam is an electromagnetic wave beam.

4. The apparatus according to claim 1, wherein the probe means detects the signal utilizing a change in dielectric constant of the specimen.

5. The apparatus according to claim 1, wherein the probe means comprises a microwave oscillator and a microwave detector, and detects the signal through microwave impedance coupling with the specimen.

6. A method for measuring a deep impurity level in a semiconductor specimen, comprising the steps of:

irradiating the specimen with an energy beam to generate minority carriers in it;

detecting, in a non-contact manner, a signal reflecting a temporal change in concentration of the minority carriers;

producing a signal decay curve on the basis of the detection signal;

storing the signal decay curve;

repeating the above steps while changing a temperature of the specimen within a predetermined range to store a plurality of the signal decay curves obtained at the respective temperatures; and determining the impurity level by performimg an Arrhenius' plot on the basis of the plurality of the signal decay curves and the corresponding temperatures.

7. The method according to claim 6, wherein the predetermined range includes a range of from about 20° C. to about 280° C.

8. The method according to claim 6, wherein the energy beam is an electromagnetic wave beam.

9. The method according to claim 6, wherein the signal is detected utilizing a change in dielectric constant of the specimen.

10. The method according to claim 6, wherein the signal is detected through microwave impedance coupling with the specimen.

* * * * *